Oct. 4, 1966 R. E. BOWLES 3,276,463

FLUID CONVERSION SYSTEMS

Filed Jan. 16, 1964 2 Sheets-Sheet 1

INVENTOR
ROMALD E. BOWLES

BY Hurvitz & Rose
ATTORNEYS

INVENTOR
RONALD E. BOWLES

BY Hurvitz & Rose
ATTORNEYS 3,276,463

FLUID CONVERSION SYSTEMS

Romald E. Bowles, 12712 Meadowood Drive, Silver Spring, Md.

Filed Jan. 16, 1964, Ser. No. 338,173
13 Claims. (Cl. 137—81.5)

This invention relates generally to fluid amplifiers, and more specifically, to systems for use with fluid amplifiers for converting electrical signals and mechanical movements to fluid signals corresponding in amplitude to the amplitude of the electrical signals or mechanical movements so converted.

Pure fluid amplifying systems of the beam deflection type are commonly utilized to effect amplification of fluid control signals supplied to the fluid amplifier. Pure fluid amplifiers of this type may be further categorized as stream-interaction-type pure fluid amplifiers and boundary-layer-type pure fluid amplifiers. U.S. Patent No. 3,024,805, for example, discloses a pure fluid amplifier of the stream-interaction-type, whereas U.S. Patent No. 3,093,306 for example, discloses a pure fluid amplifier of the boundary layer type.

For some applications, it may be advantageous to convert electrical signals and/or mechanical movements to fluid signals which are amplified by a pure fluid amplifier, the output fluid signals issuing from the amplifier corresponding to the magnitude of the electrical signals and mechanical movements that are converted. The instant invention is directed to systems that may be embodied within the structure of a pure fluid amplifier for effecting this conversion.

This invention has as the primary objective thereof the employment of conversion systems within the basic structure of a pure fluid amplifier for converting electrical signals or mechanical movements to amplified fluid output signals corresponding in amplitude to that of the electrical signals or mechanical movements.

Another object of the present invention is to provide a fluid amplifier having a mechanically moving input device so that signals supplied to the movable element may be combined with fluid signals applied to input nozzles or other fluid input elements of the amplifier.

Still another object of the present invention is to provide a pure fluid amplifier having a mechanically movable element for inserting signals or bias into the system in which the movable element is such as not to interfere with the operation of the element as an amplifier of pure fluid input signals or bias signals.

The above and still further objects, features and advantages of the present invention will become apparent upon consideration of the following detailed description of one specific embodiment thereof, especially when taken in conjunction with the accompanying drawings, wherein.

Figure 1:
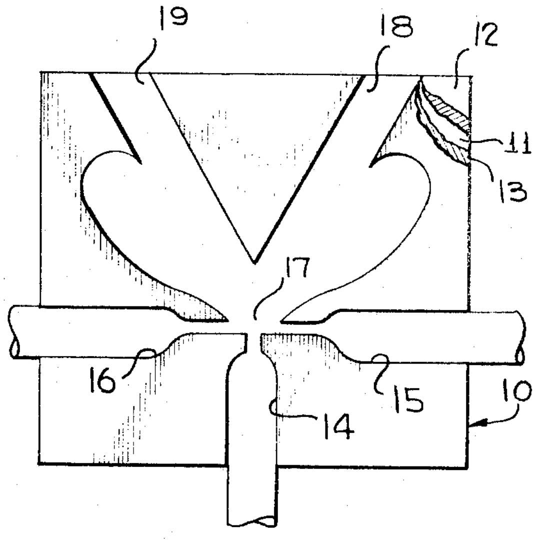
FIGURE 1 is a plan view of a typical stream-action-type of pure fluid amplifier.

Referring now to FIGURE 1 of the drawings for a more complete understanding of this invention, there is shown a pure fluid amplifier 10 of the stream interaction type. The passages and cavities and nozzles requisite for forming the amplifier 10 are preferably formed in a flat plate 11 which is sandwiched and sealed between a pair of flat plates 12 and 13 by any conventional means such as machine screws or adhesives. The plate 11 is etched, molded or otherwise formed to provide a power nozzle 14, and a pair of control nozzles 15 and 16, the control nozzles being angularly disposed with respect to the power nozzle 14 for effecting displacement of a power stream issuing from that nozzle. An interaction chamber 17 is provided downstream of the orifice of the power nozzle 14 for receiving flow from that orifice and permitting momentum interchange between the control streams and the power streams. A pair of output passages 18 and 19 are positioned downstream of the interaction chamber 17 and receive the displaced power stream, the proportion of fluid received by each output passage depending upon the relative momenta of control stream flows interacting with the power stream. The walls of the interaction chamber 17 are curved away from the orifice of the power nozzle 14 so that no boundary layer effects are developed between the power stream and these walls.

Figure 2:
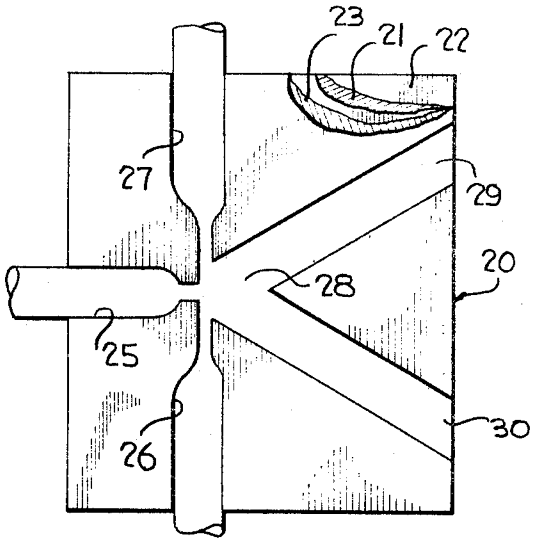
FIGURE 2 is a plan view of a typical boundary-layer-type of pure fluid amplifier.

FIGURE 2 of the drawings illustrates a pure fluid amplifier referred to by numeral 20 of conventional boundary-layer type. This amplifier is also preferably formed between three flat plates 21, 22 and 23, the configuration necessary to provide the amplifier being cut from the center plate 21. The amplifier 20 includes a power nozzle 25, a pair of control nozzles 26 and 27, an interaction chamber 28, and output passages 29 and 30, respectively. In this type of pure fluid amplifier, as distinguished from the aforedescribed stream interaction type, the sidewalls of the interaction chamber 28 are positioned sufficiently close to the orifice of the power nozzle 25 so that boundary layer effects will be developed between these sidewalls and the power stream issuing from the power nozzle. The power stream may be completely displaced into one of the output passages 29 or 30 as a result of one of the control nozzles 26 or 27, respectively, issuing a greater magnitude fluid control signal than an opposed control nozzle.

For purposes of more clearly illustrating operation of the fluid amplifier of this invention, the plates 11, 12 and 13 are shown to be composed of a clear plastic material although it will be appreciated that any material compatible with the fluid employed in the amplifier may be alternatively used. The plates 11, 12, 13 and 21, 22, 23 may be bored and the bores provided with internal threads so that tubes connecting signals to the control nozzles and a source of pressurized fluid to the power nozzles may be coupled to the amplifiers 10 and 20. Unless specifically referred to otherwise, the term "fluid amplifier" as used hereinafter should be considered as referring to an amplifier of the stream interaction type as well as to an amplifier of the boundary layer type.

Figure 3:
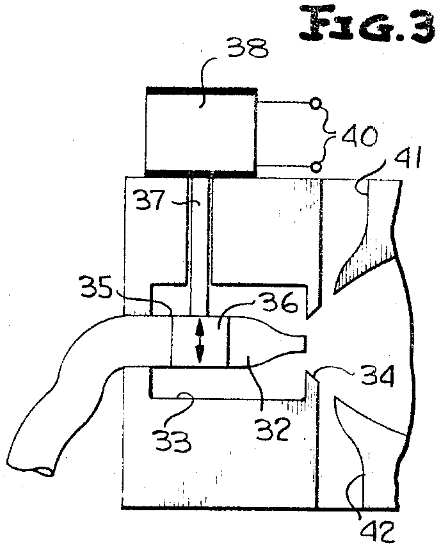
FIGURE 3 is a plan view of a power nozzle in a fluid amplifier, the power nozzle of the fluid amplifier being displaced by the plunger of a relay.

Referring now to FIGURE 3 of the accompanying drawings, there is shown the upstream end of a fluid amplifier wherein the power nozzle 32 is movable transversely to the direction of power stream flow in a cavity 33 formed in the middle plate of the amplifier sandwich structure, as indicated by the arrows. The power nozzle 32 discharges the power stream through an orifice 34 having a transverse dimension considerably larger than the transverse dimension of the power nozzle orifice and formed in the end of the interaction chamber of the amplifier. Upstream of the nozzle 32 is a flexible coupling 35 which supplies power stream fluid to the nozzle 32 and allows transverse nozzle movement. A sleeve 36 secures the nozzle 32 to a plunger 37 of a relay 38, the relay being mounted onto the side of the amplifier or onto a fixed supporting member. Conductors 40 supply current to energize the relay 38 so as to drive the plunger 37 for transverse movement.

The relay 38 may be of any conventional type that drives a plunger or core in one direction from an initial position upon energization thereof a distance depending upon the amount of current received by the relay, the plunger returning to the initial position upon subsequent de-energization of the relay. One such type of relay is, for example, disclosed in U.S. Patent No. 3,072,147. Energization of relay 38 thereby effects displacement of the power nozzle 32 relative to the orifice 34 so that a greater quantity of the power stream flows into one output passage than flows into the other. The transverse displacement of the nozzle 32 corresponds to the amount of current received by the conductors 40 so that the bias supplied to the amplifiers corresponds to the amount of current received by the relay 38. If the control nozzles 41 and 42 are issuing equal magnitude fluid streams or zero magnitude fluid streams, the displacement of the power nozzle 32 and the quantity of fluid received by each output passage of the amplifier will be solely a function of the current supplied to the relay 38. The nozzles 41 and 42 may receive signals from another part of the fluid system in which the device of FIG. 3 is incorporated so that the device may serve as both a transducer and pure fluid element. The fluid signals applied to nozzles 41 and 42 may be positive or negative feedback signals, signals derived from other transducers and supplied hereto for purposes of algebraic or arithmetic summing or may be information signals derived from fluid input or signal generating.

Figure 4:
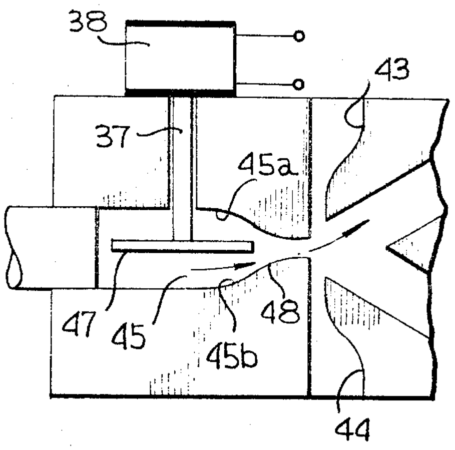
FIGURE 4 illustrates a power stream biasing vane incorporated in a power nozzle of a fluid amplifier, the position of the vane being under the control of a relay.

FIGURE 4 illustrates a system for biasing the power stream from the power nozzle 45 by means of a vane 47, the vane extending parallel to the axis of the nozzle 45 and being affixed to the plunger 37 of the relay 38. The leading edge of the vane 47 extends far enough upstream of the nozzle 45 so as to produce pressure differentials between the sidewalls *45a* and *45b* of the nozzle 45 as a result of transverse displacement of the plunger 37. For instance, if the vane 47 is displaced closer to the sidewall *45a* than to the sidewall *45b*, there will be a greater resistance to fluid flow between the sidewalls *45a* and the vane 47 than between the vane 47 and the sidewall *45b*, so that the fluid issuing from the nozzle 45 will be biased as indicated by the arrows into the left output passage, as viewed in this figure. Control stream flow from control nozzles 43 and 44 may be utilized to effect further displacement of the power stream issuing from the power nozzle orifice 48, so as to provide an output signal which is a function of the signal applied to relay 38 and control nozzles 43 and/or 44.

Figure 5:
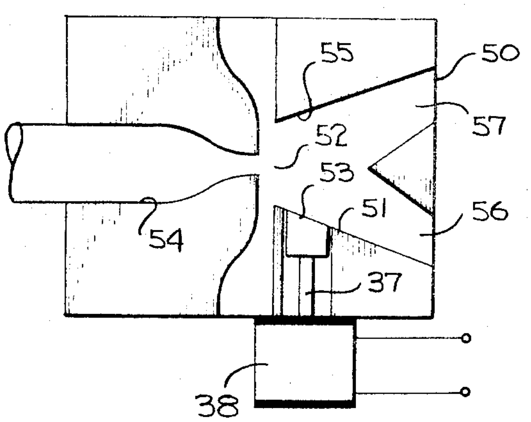
FIGURE 5 is a plan view of a fluid amplifier of the boundary-layer-type illustrating the control of fluid output from the amplifier by displacement of a sidewall of an interaction chamber.

FIGURE 5 illustrates a pure fluid amplifier 50 of the boundary layer type wherein one of the sidewalls 51 defining the interaction chamber 52 is provided with a movable section 53 opposite the sidewall 55. The relative positions between the sidewall section 53 and the upstream section of the sidewall 55 opposite the sidewall section 53 relative to the orifice of the power nozzle 54 will determine the sidewall onto which the power stream will attach, the power stream tending to become attached to the sidewall section closest the power nozzle orifice. It will be evident that if the section 53 is closer to the orifice of the power nozzle 54 than the sidewall 55, the power stream will be biased to attach to the section 53 rather than to the sidewall 55. In the type amplifier illustrated, if the power stream attaches to the sidewall section 53, all power stream flow will egress from the output passage 56. Conversely, if the sidewall section 53 is moved inwardly of the sidewall 51 so that the distance between the power nozzle orifice and the sidewall 55 is less than that between the power nozzle orifice and the sidewall section 53, there will be a greater tendency for the power stream to become attached to the sidewall 55 rather than to the sidewall section 53. If attachment is made to the sidewall 55, power stream flow will issue from the output passage 57 rather than from the output passage 56. Movement of the sidewall section 53 can be effected by movement of the plunger 37, and therefore the bias of the power stream relative to the output passages will be related to the current received by the relay 38 for actuating the plunger 37, assuming non-varying control stream flows.

The control initiated by the relay 38 may be overcome or enhanced by the application of signals to the control nozzles. Also the unit of FIG. 5 may comprise an analog amplifier employing signal enhancement by positive feedback. In such a device analog operation may be obtained by sidewall setback, divider placement, sidewall angle with the centerline of the power nozzle a combination of these, all as taught in co-pending application 58,188 filed October 19, 1960, in the names of Raymond W. Warren and Romald E. Bowles. Under these circumstances movement of the plunger 37 increases or decreases the positive feedback due to boundary layer effects and therefore the output signal is a function of input signals applied to the control nozzles and the position of element 53.

Figure 6:
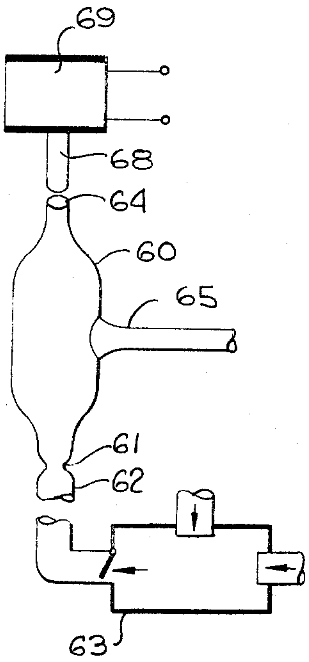
FIGURE 6 illustrates a system for providing a control fluid signal to the control nozzle of a fluid amplifier.

FIGURE 6 illustrates another embodiment of this invention wherein a nozzle 60 is provided with a constriction 61 in the upstream end thereof, the constriction 61 being formed in a tube 62 connecting the upstream end of the nozzle 60 to a source 63 of pressurized fluid. The downstream end of the nozzle 60 converges to an orifice 64 from which a constricted fluid stream issues. A fluid discharge tube 65 is connected to the nozzle 60 intermediate the restrictions 61 and 64, the quantity of fluid discharged to the tube 65 being governed by the quantity of fluid egressing from the orifice 64 under conditions wherein the pressure of source 63 is constant.

A cylindrical plunger 68 actuated by a relay 69 is positioned to vary the backloading of the orifice 64 and hence, the flow of fluid from the orifice 64 in accordance with the displacement of the plunger 68 relative to the orifice 64. If the plunger 68 is actuated to permit substantially unrestricted flow from the orifice 64, the tube 65 will discharge its minimum amount of fluid from the nozzle 60 whereas the movement of the plunger 68 to a position where flow from the orifice 64 is prevented results in all flow received by the nozzle 60 issuing from the tube 65. Flow from the tube 65 is thus a function of plunger position relative to the orifice 64 and the plunger position is a function of the current received by the relay 69. Tube 65 may be connected to a control nozzle of a pure fluid amplifier so that the displacement of the power stream of that amplifier is a function of the current received by the relay 69.

Figure 7:
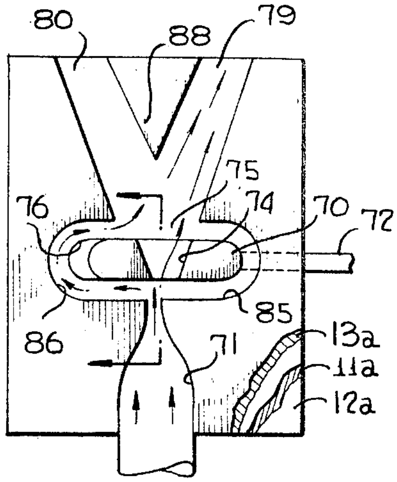
FIGURE 7 is a plan view of a fluid amplifier incorporating an element for diverting the power stream by combined boundary layer and momentum exchange effects.

Referring now to FIGURE 7 of the drawing, there is shown a fluid amplifier basically of the stream interaction type incorporating a power stream diverting element, referred to generally by the numeral 70, the diverter being movable in a direction transverse to that of power stream flow from a power nozzle 71. One end of a connecting rod 72 is affixed to the lower surface 82 of the element 70, the other end of the rod being connected to a drive rod, plunger or linkage mechanism. The amount of displacement of the rod 72 is converted to differential fluid output signals in channels 79 and 80 that correspond to this displacement.

Figure 8:
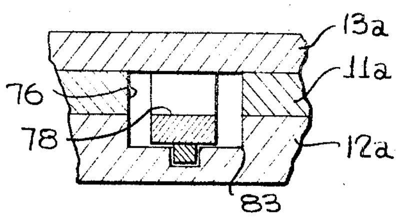
FIGURE 8 is a sectional side view of FIGURE 7 taken on section line 8—8 of FIGURE 7.
Figure 9:
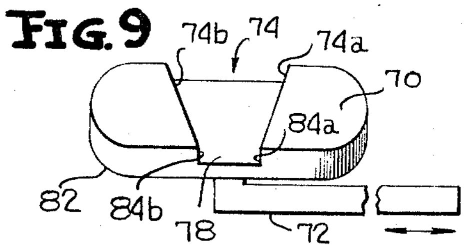
FIGURE 9 is a perspective view of the power stream diverting element illustrated in FIGURE 7.

The element 70 is formed with an elongated body having essentially elliptical ends and a slot 74 is provided intermediate the ends of the element 70, the sides *74a* and *74b* of the slot 74 diverging in the direction of power stream flow. The element 74 is movable in the interaction chamber 75 of the fluid amplifier in a slot 76 of elongated shape formed in the plates 11a and 12a, FIGURES 7 and 8, the slot 76 extending through the center plate 11a and into the lower plate 12a of the amplifier. The bottom surface 78 of the slot 74 is preferably flush with the upper surface of the plate 12a so that the power stream flows across the bottom face 78 and into the entrances of output passages 79 and 80, respectively, the output passages 79 and 80 being partially formed by the sides of a flow splitter 88. The bottom surface 82 of the diverter 70 is supported from movement in the interaction chamber by shoulders 83, FIGURE 8, formed in the bottom plate 12a. The ends of the slot 76 limit transverse movement of the element 70 with respect to the concave sidewalls 85 and 86 of the interaction chamber 75. Preferably, the transverse movement of the element 70 is limited so that, at either extreme of the two possible element positions relative to the chamber walls 85 and 86, the upstream edges 84a and 84b of the slot 74 do not block off all flow into the slot 74 from the power nozzle 71. The radius of curvature of the sidewalls 85 and 86 which form part of the interaction chamber 75 is preferably slightly larger than the radius of curvature of the ends of the element 70 so that a passage for fluid flow is provided between the convex-shaped surfaces of the element 70 and the concave sections of the interaction chamber walls 85 and 86.

With the linkage 72 moved to the extreme right as viewed in FIGURE 7, a portion of fluid from the power nozzle 71 will flow across the surface 78 of the element 70 and because of the setback of the sidewall 74a from the edges of the power stream, the stream will aspirate the region between the right edge thereof and the sidewall 74a, causing a reduction in pressure along the right side of the power stream. This reduction in pressure tends to bias the power stream towards the right. The edge 84b of the element 70 receives impinging flow from a portion of the power stream that does not flow into the slot 74 because this edge has been moved to a position projecting into the power stream. As a result, at this edge, there will be a high pressure region and a portion of the power stream fluid will flow between the sidewall 85 of the interaction chamber 75 and the surface of the element 70, as shown by the arrows in FIGURE 7.

As the fluid issues from the space defined, in part, by the sidewall 86, it flows transversely across the interaction chamber 75 downstream of the element 70 and into the interaction with that portion of the power stream issuing from the slot 74, thereby causing further displacement of the power stream issuing from the power nozzle 71 into the output passage 79. It will be evident that the element 70 provides, with sidewalls 85 and 86 a pair of coupled control nozzles. The input fluid in the control nozzles is varied differentially with movement of element 70. This feature, together with the sharp angle of divergence of the elements 70a and 70b which minimizes boundary layer effects, provide analog operation on a differential input signal. It is apparent that additional control nozzles may be added.

Movement of the linkage 72 to the left as viewed in FIGURE 7 will, for reasons discussed hereinabove, effects displacement of the power stream issuing from the power nozzle 71 into the entrance of the output passage 80. When the slot 74 of the diverter 70 is symmetrical with respect to the interaction chamber 75 and the power nozzle 71, the sidewalls of the slot are sloped at a diverging angle sufficiently and do not overhang the orifice of the power nozzle so that boundary layer effects are not created by the diverter 70 and the output passages 79 and 80 receive quantities of power stream fluid as determinned by other design parameters of the amplifier either analog or digital in nature, as a result of the power stream being divided by the flow splitter 88.

While I have described and illustrated one specific embodiment of my invention, it will be clear that variations of the details of construction which are specifically illustrated and described may be resorted to without departing from the true spirit and scope of the invention as defined in the appended claims.

What I claim is:

1. A fluid amplifier comprising a power nozzle for issuing a defined power stream, a chamber positioned to receive and confine the power stream, said chamber including a pair of opposed diverging sidewalls, at least one control nozzle for developing a variable pressure gradient across said stream and a flow splitter located downstream of said chamber for splitting the power stream into plural streams, the quantity of fluid in each of said plural streams being a function of power stream displacement in said chamber, and means located in said chamber upstream of said flow splitter for effecting power stream displacement, said means being movable in directions perpendicular to the direction of power stream flow, said means comprising a power stream diverting element having an aperture formed therein, said power stream passing through said aperture in said element.

2. A fluid amplifier comprising a nozzle for issuing a defined stream of fluid, an interaction chamber positioned downstream of said nozzle for receiving fluid therefrom, said chamber including a pair of opposed sidewalls, plural output passages located downstream of said chamber for receiving fluid issuing therefrom, a member in said interaction chamber positioned at a substantial angle to the direction of stream flow, said member formed with an aperture therein, said aperture being in substantial alignment with the direction of stream flow in said chamber, said member being spaced from said sidewalls of said interaction chamber so that at least a portion of the fluid stream flow is guided between one of said sidewalls and an adjacent portion of said member into interaction with fluid flowing through said aperture in said member.

3. The fluid amplifier as claimed in claim 2 wherein a section of each of said sidewalls of said chamber is concave and wherein said member is provided with ends of convex shape, the radius of curvature of the convex ends being substantially the same as the radius of curvature of adjacent concave sections of said sidewalls.

4. The fluid amplifier as claimed in claim 2 wherein said slot is formed by a pair of opposed sidewalls diverging in the direction of fluid stream flow in said interaction chamber.

5. The fluid amplifier as claimed in claim 2 wherein said member is mounted for translation in said interaction chamber in directions at an angle with respect to the direction of stream flow, and wherein means are provided for producing translating movement to said member.

6. The fluid amplifier as claimed in claim 5 wherein a groove is formed in said interaction chamber for guiding said member during movement thereof.

7. A fluid amplifier concurrently responsive to mechanical and fluid input signals; comprising an interaction region, a pair of output passages adjacent one end of said interaction region, a power nozzle for directing a stream of fluid through said interaction region in the general direction of said output passages, movable mechanical means located upstream of said output passages for effecting displacement of said stream of fluid as a continuous function of displacement of said movable mechanical means and fluid control means for developing a differential pressure across said stream of fluid to produce further displacement of said stream of fluid as a continuous function of said differential in pressure.

8. The fluid amplifier as claimed in claim 7 wherein said interaction region includes sidewalls defining transverse limits of said interaction region and wherein said movable mechanical means comprises a section of one of said sidewalls of said chamber.

9. The fluid amplifier as claimed in claim 7 wherein said means comprises a plate located in said power nozzle and generally aligned with the axis thereof.

10. The combination according to claim 7 wherein said movable mechanical means includes said power nozzle.

11. The combination according to claim 7 wherein said movable mechanical means includes a member located in said power nozzle, said member extending generally parallel to the axis of said nozzle and means for translating said member transverse to said axis.

12. The combination according to claim 7 wherein said movable mechanical means is located in said interaction region.

13. A fluid amplifier comprising a power nozzle for issuing a defined power stream, a chamber positioned to receive and confine the power stream, said chamber including a pair of opposed diverging sidewalls, at least two control nozzles disposed on opposite sides of said power nozzle for developing a variable pressure gradient across said stream and a flow splitter located downstream of said chamber for splitting the power stream into plural streams, the quantity of fluid in each of said plural streams being a function of power stream displacement in said chamber, and means located in said chamber upstream of said flow splitter for effecting power stream displacement, said means being movable in directions perpendicular to the direction of pore stream flow.

References Cited by the Examiner

UNITED STATES PATENTS

| | | | |
|---|---|---|---|
| 2,228,015 | 1/1941 | Neukirch. | |
| 3,004,547 | 10/1961 | Hurvitz | 137—81.5 X |
| 3,005,533 | 10/1961 | Wadey | 137—81.5 |
| 3,072,147 | 1/1963 | Allen et al. | 137—81.5 |
| 3,102,389 | 9/1963 | Pedersen et al. | |
| 3,148,691 | 9/1964 | Greenblott | 137—81.5 |
| 3,180,346 | 4/1965 | Duff | 137—81.5 |

FOREIGN PATENTS

| | | |
|---|---|---|
| 1,083,607 | 6/1960 | Germany. |

M. CARY NELSON, *Primary Examiner.*

S. SCOTT, *Assistant Examiner.*